(12) United States Patent
Kim et al.

(10) Patent No.: US 12,494,299 B2
(45) Date of Patent: Dec. 9, 2025

(54) BETAVOLTAIC BATTERY AND METHOD FOR MANUFACTURING BETAVOLTAIC BATTERY

(71) Applicant: KOREA ATOMIC ENERGY RESEARCH INSTITUTE, Daejeon (KR)

(72) Inventors: Dong Seok Kim, Daegu (KR); Young Jun Yoon, Daegu (KR); Jae Sang Lee, Daegu (KR)

(73) Assignee: KOREA ATOMIC ENERGY RESEARCH INSTITUTE, Daejeon (KR)

( * ) Notice: Subject to any disclaimer, the term of this patent is extended or adjusted under 35 U.S.C. 154(b) by 423 days.

(21) Appl. No.: 18/011,487

(22) PCT Filed: Jun. 22, 2021

(86) PCT No.: PCT/KR2021/007846
§ 371 (c)(1),
(2) Date: Dec. 19, 2022

(87) PCT Pub. No.: WO2021/261896
PCT Pub. Date: Dec. 30, 2021

(65) Prior Publication Data
US 2023/0282384 A1    Sep. 7, 2023

(30) Foreign Application Priority Data

Jun. 22, 2020   (KR) .................. 10-2020-0075892

(51) Int. Cl.
*G21H 1/06*    (2006.01)
*G21H 1/02*    (2006.01)

(52) U.S. Cl.
CPC .............. *G21H 1/06* (2013.01); *G21H 1/02* (2013.01); *Y02P 70/50* (2015.11)

(58) Field of Classification Search
CPC .................................. G21H 1/06; G21H 1/02
See application file for complete search history.

(56) References Cited

U.S. PATENT DOCUMENTS

| 10,971,655 | B2 | 4/2021 | Park |
| 2016/0379729 | A1* | 12/2016 | Roizin ............... G21H 1/06 |
| | | | 310/303 |
| 2020/0295230 | A1 | 9/2020 | Park |

FOREIGN PATENT DOCUMENTS

| CN | 103730182 A | 4/2014 |
| KR | 10-0861385 B1 | 10/2008 |

(Continued)

OTHER PUBLICATIONS

International Search Report issued on Oct. 14, 2021, for corresponding International Patent Application No. PCT/KR2021/007846, along with an English translation (5 pages).

(Continued)

*Primary Examiner* — Matthew L Reames
(74) *Attorney, Agent, or Firm* — Hauptman Ham, LLP (57) ABSTRACT

The present invention relates to a betavoltaic battery comprising: a substrate; an intrinsic semiconductor unit disposed on the substrate; an N-type semiconductor unit and a P-type semiconductor unit that are disposed on at least a portion of a surface of the intrinsic semiconductor unit and arranged alternately; and beta ray sources that are disposed on the N-type semiconductor unit and the P-type semiconductor unit. The present invention also relates to a method for manufacturing a betavoltaic battery, comprising the steps of: (A) forming an intrinsic semiconductor unit on a substrate; (B) forming an N-type semiconductor unit and a P-type semiconductor unit alternately by irradiating at least a portion of the surface of the intrinsic semiconductor unit (Continued)

with an ion beam; and (C) disposing a beta ray source on the N-type semiconductor unit and the P-type semiconductor unit.

16 Claims, 6 Drawing Sheets

(56) References Cited

FOREIGN PATENT DOCUMENTS

| KR | 10-2010-0089635 A | 8/2010 |
|---|---|---|
| KR | 10-1041729 B1 | 6/2011 |
| KR | 10-1546310 B1 | 8/2015 |
| KR | 10-2017-0094857 A | 8/2017 |
| KR | 10-2017-0116686 A | 10/2017 |

OTHER PUBLICATIONS

Written Opinion issued on Oct. 14, 2021, for corresponding International Patent Application No. PCT/KR2021/007846 (3 pages).

Aydin, S. et al., "Investigation of nickel-63 radioisotope-powered GaN betavoltaic nuclear battery", International Journal of Energy Research, Sep. 5, 2019, vol. 43, No. 14, pp. 8725-8738, cited in NPL Nos. 1 and 2.

Shi, Ya-Ting et al., "Realization of p-type gallium nitride by magnesium ion implantation for vertical power devices", Scientific Reports, Jun. 19, 2019, vol. 9, No. 1, pp. 1-9, cited in NPL Nos. 1 and 2.

Yoon, Young Jun et al., "Design and optimization of GaN-based betavoltaic cell for enhanced output power density", International Journal of Energy Research, Sep. 27, 2020, vol. 45, No. 1, pp. 799-806, cited in NPL No. 1.

Han, Min Gu et al., "Improving electric characteristics of GaN devices employing proton irradiation", Apr. 30, 2009, Researched by Seoul National University, along with an English partial translation (40 pages).

\* cited by examiner

PRIOR ART

BETAVOLTAIC BATTERY AND METHOD FOR MANUFACTURING BETAVOLTAIC BATTERY

CROSS REFERENCE TO RELATED APPLICATION

The present application is a national stage filing under 35 U.S.C § 371 of PCT application number PCT/KR2021/007846 filed on Jun. 22, 2021, which is based upon and claims the benefit of priority to Korean Patent Application No. 10-2020-0075892, filed on Jun. 22, 2020, in the Korean Intellectual Property Office. All of the aforementioned applications are incorporated herein by reference in their entireties.

TECHNICAL FIELD

The present invention relates to a betavoltaic battery and a method for manufacturing the betavoltaic battery.

BACKGROUND ART

A betavoltaic battery is a battery that uses technology to produce electrical energy by absorbing beta rays emitted from a radioactive isotope into the p-n junction semiconductor layer of a semiconductor. In particular, the betavoltaic battery has an advantage that it is not affected by changes in the surrounding environment, generates power on its own without an external power source, and can stably generate power even in extreme environments such as extremely low or high temperatures. In addition, in the case of the betavoltaic battery, the longer the half-life of the isotope used as the source of beta rays, the longer the lifetime of the betavoltaic battery, and thus it can be used semi-permanently by dramatically overcoming the short lifetime of existing batteries.

Since the betavoltaic battery does not require separate charging and has a long lifetime, it can be used not only as a power source for devices for the Internet of Things, but also as a battery in extreme environments where charging is difficult, and in particular, it is in the limelight as a next-generation power source that can be used in micro-scale electronic devices, such as medical cardiac pacemakers (implantable medical devices, etc.), social communication network sensors, infrastructure facilities, etc.

In general, the betavoltaic battery is implemented in the lamination order of an n-type semiconductor layer-p-type semiconductor layer-beta ray emission unit (p-n junction semiconductor layer) or n-type semiconductor layer-intrinsic semiconductor layer-P-type semiconductor layer-beta ray emission unit (p-i-n junction semiconductor layer). However, in the case of manufacturing a betavoltaic battery using the above structure as it is, there is a limitation in improving the characteristics. Particularly, in order to generate electron-hole pairs, beta particles generated from the radioactive isotope located on the surface of the betavoltaic battery must penetrate the depletion region (space charge region). However, since the depletion region is limited to the junctional region of the p-type semiconductor layer and the intrinsic semiconductor layer, or the junctional region of the n-type semiconductor layer and the intrinsic semiconductor layer, consequently, the surface area of the betavoltaic battery must be increased to enlarge the depletion region.

However, if the total area of a betavoltaic battery is increased, it is not suitable as a power supply for micro-scale electronic devices. In addition, in the structure of the betavoltaic battery as above, beta particles that are absorbed or scattered in the p-type semiconductor layer are increased in course of the beta particles passing through the p-type semiconductor layer and reaching the depletion region formed in the space past a certain depth from the surface, which can cause a lot of loss. The loss of these beta particles has a problem that it reduces the overall electron-hole pair generation rate in the depletion region, thereby degrading the characteristics of the betavoltaic battery. In addition, an etching process is required to form the n-type electrode in the process, but the etched part has a disadvantage that it does not produce power, and since many interatomic defects may exist on the etched surface, there is a problem in that additional power loss occurs.

DISCLOSURE

Technical Problem

In order to solve the above problems, the present invention is to provide a betavoltaic battery with improved battery characteristics by forming a structure in which an n-type semiconductor unit and a p-type semiconductor unit are alternately arranged on at least a portion of the surface of an intrinsic semiconductor unit using ion beam technology, and thus increasing the surface area of the depletion region and directly introducing beta particles into the depletion region without loss, and furthermore by incorporating a barrier portion with a large energy band gap inside the intrinsic semiconductor unit and thus forming an energy barrier to prevent leakage of electrons and holes into the substrate.

Technical Solution

One embodiment of the present invention provides a betavoltaic battery including a substrate; an intrinsic semiconductor unit disposed on the substrate; an n-type semiconductor unit and a p-type semiconductor unit that are disposed on at least a portion of a surface of the intrinsic semiconductor unit and arranged alternately; and beta ray sources that are disposed on the n-type semiconductor unit and the p-type semiconductor unit.

Another embodiment of the present invention provides a method for manufacturing a betavoltaic battery comprising the steps of (A) forming an intrinsic semiconductor unit on a substrate; (B) forming an n-type semiconductor unit and a p-type semiconductor unit alternately by irradiating at least a portion of the surface of the intrinsic semiconductor unit with an ion beam; and (C) disposing a beta ray source on the n-type semiconductor unit and the p-type semiconductor unit.

Advantageous Effects

Unlike betavoltaic batteries with an existing p-n junction structure (or p-i-n junction structure), since the betavoltaic battery of the present invention has a structure in which n-type semiconductor units and p-type semiconductor units are alternately arranged on at least a portion of the surface of the intrinsic semiconductor unit using ion beam technology, the depletion region is exposed to the outside, and thus beta particles generated from the beta ray source can be introduced into the depletion region without loss.

In addition, if a barrier portion having a large energy band gap is comprised inside the intrinsic semiconductor unit, an energy barrier can be formed to prevent electrons and holes from leaking into the substrate, and thus it has the effect of improving the characteristics of the battery by increasing the energy conversion efficiency of the betavoltaic battery.

Furthermore, unlike the prior art, since the etching process for forming the electrode can be omitted, the flatness of the betavoltaic battery can be maintained, thereby improving the fabrication yield.

BEST MODE

The present invention may have various changes and may have various embodiments, and thus specific embodiments are illustrated in the drawings and described in detail in the detailed description. However, this is not intended to limit the present invention to specific embodiments, and it should be understood that the present invention comprises all modifications, equivalents, and substitutes comprised in the spirit and scope of the present invention.

The terms used in this specification are only used to describe specific embodiments, and are not intended to limit the present invention. Singular expressions include plural expressions, unless the context clearly indicates otherwise.

The expression "on" used in this specification may mean that members are directly joined and attached to each other, or may mean that members are positioned adjacent to each other.

Therefore, the configuration shown in the embodiments described in this specification is only one preferred embodiment of the present invention, and does not represent all the technical ideas of the present invention, and thus at the time of filing of the present invention, there may be various equivalents and modifications that can be substituted for them.

Hereinafter, the present invention will be described in detail.

1. Betavoltaic Battery

The present invention provides a betavoltaic battery.

The betavoltaic battery may comprise a substrate; an intrinsic semiconductor unit disposed on the substrate; an n-type semiconductor unit and a p-type semiconductor unit that are disposed on at least a portion of a surface of the intrinsic semiconductor unit and arranged alternately; and beta ray sources disposed on the n-type semiconductor unit and the p-type semiconductor unit.

The substrate may include at least one selected from sapphire ($Al_2O_3$), silicon carbide (SiC), diamond, gallium nitride (GaN), and silicon (wafer).

The substrate may include the same material as the p-type semiconductor unit, the n-type semiconductor unit, and the intrinsic semiconductor unit, or may include materials different from these. If the substrate comprises the same material as the p-type semiconductor unit, the n-type semiconductor unit, and the intrinsic semiconductor unit, the occurrence of defects at the bonding interface is relatively reduced, and thus there is an effect of improving the quality of the thin film, compared to the case of including different materials.

Unlike the p-type semiconductor unit and the n-type semiconductor unit, the intrinsic semiconductor unit may be undoped with impurities, and may comprise, for example, gallium nitride (GaN).

The intrinsic semiconductor unit may be formed by depositing on the substrate, and the method of depositing the intrinsic semiconductor unit on the substrate may use a thin film growth technology comprising a molecular beam epitaxy (MBE), a metal organic chemical vapor deposition (MOCVD), or a hydride vapor phase epitaxy (HVPE) used in the fabrication of a thin film, but is not limited thereto. Specifically, in depositing GaN on the substrate, the use of the metal organic chemical vapor deposition (MOCVD) is advantageous in that due to the hexagonal fiber zinc crystal structure and growth direction characteristics of GaN, it is possible to obtain a thin film having a higher quality and deposit it on a plurality of substrates at the same time.

The background electron concentration of the intrinsic semiconductor unit may be $5 \times 10^{16}/cm^3$ or less. If the background electron concentration of the intrinsic semiconductor unit exceeds $5 \times 10^{16}/cm^3$, a problem that does not properly function as a depletion region may occur.

The n-type semiconductor unit and the p-type semiconductor unit may be alternately arranged on at least a portion of the surface of the intrinsic semiconductor unit.

The n-type semiconductor unit and the p-type semiconductor unit may include gallium nitride (GaN). As above, if GaN is included, the betavoltaic battery can be used in extreme situations such as high voltage, high current, and high temperature. In addition, since the GaN has a large bandgap energy (3.4 eV), it has the advantage that the semiconductor unit is not easily damaged due to its high resistance to radiation.

The n-type semiconductor unit may include one in which a portion of the intrinsic semiconductor unit is doped with an n-type impurity, and the n-type semiconductor unit may be one formed by doping at least a portion of the intrinsic semiconductor unit using an ion beam derived from an element in group 4 of the periodic table.

The n-type impurity may be, but is not limited to, a compound containing a tetravalent element, such as a silicon-based compound, a carbon-based compound, or a germanium-based compound.

The background electron concentration of the n-type semiconductor unit is $5 \times 10^{17}/cm^3$ or more. If the background electron concentration of the n-type semiconductor unit is less than $5 \times 10^{17}/cm^3$, there may be a problem that the resistance of the thin film is increased, and it may not properly function as a current diffusion layer, and thus the characteristic of the betavoltaic battery is degraded.

The p-type semiconductor unit may comprise one in which a portion of the intrinsic semiconductor unit is doped with a p-type impurity, and the p-type semiconductor unit may be one formed by doping at least a portion of the intrinsic semiconductor unit using an ion beam derived from an element in group 2 of the periodic table.

The p-type impurity may be, but is not limited to, a compound containing a divalent element, such as a magnesium-based compound or a calcium-based compound.

The background hole concentration of the p-type semiconductor unit is $1\times10^{17}/cm^3$ or more. If the background hole concentration of the p-type semiconductor unit is less than $1\times10^{17}/cm^3$, there may be a problem that the resistance is increased and the junction is not properly formed.

The thicknesses of the p-type semiconductor unit and the n-type semiconductor unit may be adjusted depending on the type of the beta ray source included in the betavoltaic battery, i.e., the distribution of absorption energy in the GaN semiconductor unit according to the average energy of the radioactive isotope. For example, in the case of Pm-147, which has a higher beta emission energy than that of Ni-63, the thickness of the p-type semiconductor unit and the n-type semiconductor unit can be adjusted to be thicker than when Ni-63 is used as a beta ray source.

Specifically, if the radioactive isotope of the beta ray source comprises Ni-63, the thickness of the p-type semiconductor unit may be 200 to 300 nm. If the radioactive isotope comprises H-3, the thickness of the p-type semiconductor unit may be 20 to 60 nm, and if the radioactive isotope comprises Pm-147, the thickness of the p-type semiconductor unit may be 1,200 to 1,300 nm.

The thickness of the p-type semiconductor unit may mean a depth from at least a portion of the surface of the intrinsic semiconductor unit, to which an ion beam is irradiated, to a portion where ion beam energy reaches and is doped. If the thickness of the p-type semiconductor unit satisfies the above range, the characteristics of the betavoltaic battery become excellent.

As described above, the thickness of the n-type semiconductor unit can be adjusted depending on the type of the beta ray source comprised in the betavoltaic battery, i.e., the distribution of absorption energy in the GaN semiconductor unit according to the average energy of the radioactive isotope.

The thickness of the n-type semiconductor unit may be equal to or smaller than that of the p-type semiconductor unit. Specifically, since the doping concentration of the p-type semiconductor unit is low, as the thickness of the n-type semiconductor unit is smaller than the thickness of the p-type semiconductor unit, the depletion region due to the p-type semiconductor becomes wider, and thus the energy conversion efficiency can be improved, thereby improving the characteristics of the betavoltaic battery.

For example, if the radioactive isotope of the beta ray source comprises Ni-63, the thickness of the n-type semiconductor unit may be 100 to 200 nm. Specifically, if the thickness of the n-type semiconductor unit is smaller than that of the p-type semiconductor unit, as the depletion region is widened, the energy conversion efficiency can be improved, thereby improving the characteristics of the betavoltaic battery.

Since the n-type semiconductor unit and the p-type semiconductor unit may be alternately arranged on at least a portion of the surface of the intrinsic semiconductor unit, the intrinsic semiconductor unit may be disposed between the n-type semiconductor unit and the p-type semiconductor unit. In this case, the width of the intrinsic semiconductor unit disposed between the n-type semiconductor unit and the p-type semiconductor unit may be 100 to 500 nm. The width of the intrinsic semiconductor unit disposed between the n-type semiconductor unit and the p-type semiconductor unit may mean the shortest distance between the n-type semiconductor unit and the p-type semiconductor unit.

If the width of the intrinsic semiconductor unit disposed between the n-type semiconductor unit and the p-type semiconductor unit satisfies the above range, as the depletion region is increased, it may be possible to increase the probability of the formation of electron-hole pairs originating from injected beta particles.

The depletion region may be one formed at a boundary where the p-type semiconductor unit and the n-type semiconductor unit respectively contact the intrinsic semiconductor unit.

The beta ray source serves to provide an energy source to the semiconductor unit by emitting beta rays, wherein the beta ray source may include a radioactive isotope capable of emitting beta rays. The beta ray source is not limited thereto, as long as it is a member of the form containing a radioactive isotope capable of emitting beta rays. Specifically, the beta ray source may be a radioactive isotope-containing layer capable of emitting beta rays.

The beta ray source may be disposed adjacent to the n-type semiconductor unit and the p-type semiconductor unit. That is, the beta ray source may be in contact with the n-type semiconductor unit and the p-type semiconductor unit, and the beta ray source may be spaced apart from the n-type semiconductor unit and the p-type semiconductor unit by a predetermined distance.

The radioactive isotope may include at least one selected from nickel (Ni-63), promethium (Pm-147), and tritium (H-3).

Particularly, if nickel (Ni-63) is included as the radioactive isotope, since it has an average energy of about 17.4 keV and a maximum energy of about 67 keV, the maximum energy is low and thus the semiconductor unit may not be damaged. In addition, since it has a half-life of 100 years or more, it is possible to manufacture a betavoltaic battery with an almost semi-permanent lifetime.

The betavoltaic battery may further comprise a barrier portion disposed inside the intrinsic semiconductor unit. The barrier portion is disposed inside the intrinsic semiconductor unit. For example, as a barrier portion is formed on the intrinsic semiconductor unit and then an additional intrinsic semiconductor unit is deposited and formed on the barrier portion, the barrier portion may be disposed inside the intrinsic semiconductor unit.

The barrier portion may be formed by growing a thin film using the above-described deposition method.

The barrier portion may comprise a material having an energy band gap larger than the intrinsic semiconductor unit. If the barrier portion comprising a material having a large energy band gap is disposed inside the intrinsic semiconductor unit, since an energy barrier for electrons or holes is formed, a diffusion phenomenon of electrons derived from the n-type semiconductor unit or holes derived from the p-type semiconductor unit to the substrate can be suppressed, and thus leakage of carriers can be reduced.

For example, the barrier portion may comprise an aluminum gallium nitride (AlGaN)-based material having a larger energy band gap than GaN comprised in the intrinsic semiconductor unit.

In this case, the aluminum gallium nitride (AlGaN)-based material may include aluminum (Al) in an amount of 25 to 40 mol %, based on the total number of moles of aluminum (Al) and gallium (Ga) in the aluminum gallium nitride-based material.

Specifically, the barrier portion may include an aluminum gallium nitride (AlGaN)-based material represented by Formula 1 below.

$$Al_xGa_{1-x}N \quad \text{[Formula 1]}$$

wherein x is 0.25 to 0.4.

If the content of Al in the aluminum gallium nitride-based material satisfies the above range, a high energy barrier may be formed, and thus high current characteristics can be exhibited inside the betavoltaic battery. If the content of Al in the aluminum gallium nitride-based material is less than 25 mol %, there may be a problem that the barrier portion does not form a sufficiently high energy barrier to prevent leakage of carriers. If the content exceeds 40 mol %, there may be a problem that since the difference in lattice size between the material of the barrier portion (aluminum gallium nitride (AlGaN)-based material) and the material of the intrinsic semiconductor unit (GaN) is increased, defects occur during the growth of the thin film and the overall characteristics are deteriorated.

The barrier portion is disposed in an internal region of the intrinsic semiconductor unit, and the position where the barrier portion is disposed in an internal region of the intrinsic semiconductor unit may be adjusted depending on the type of beta ray source, i.e., the average energy of the radioactive isotope.

Specifically, if the radioactive isotope of the beta ray source comprises Ni-63, the barrier portion may be disposed in an inner region located at a distance of 1 to 1.5 µm from the surface of the intrinsic semiconductor unit. If the radioactive isotope comprises H-3, the barrier portion may be disposed in an inner region located at a distance of 200 to 500 nm from the surface of the intrinsic semiconductor unit. If the radioactive isotope comprises Pm-147, the barrier portion may be disposed in an inner region located at a distance of 3.5 to 4 µm from the surface of the intrinsic semiconductor unit.

If the barrier portion is disposed at a distance within the above range, there is an effect that the diffusion of electrons or holes derived from injected beta particles can be effectively suppressed, and thus the energy conversion efficiency is increased and the generation of high power is possible.

The thickness of the barrier portion (thickness in a vertical direction) may be 50 to 1000 nm. If the thickness of the barrier portion is less than 50 nm, the thickness of the energy barrier becomes thinner, and thus the problem of the leakage of carriers may occur through a tunneling phenomenon. If the thickness of the barrier portion exceeds 1000 nm, there may be a problem that defects are generated during the growth of the intrinsic semiconductor unit on the barrier portion.

The betavoltaic battery may further comprise a p-type electrode electrically connected to the p-type semiconductor unit; and an n-type electrode electrically connected to the n-type semiconductor unit.

The n-type electrode may be a positive electrode and the p-type electrode may be a negative electrode, or the n-type electrode may be a negative electrode and the p-type electrode may be a positive electrode.

In this case, the p-type electrode may be formed in a portion of the p-type semiconductor unit and electrically connected to it, and the n-type electrode may be formed in a portion of the n-type semiconductor unit and electrically connected to it, but they are not limited thereto, and they may be disposed in various arrangements and shapes as long as they are electrically connected.

The n-type electrode may include aluminum (Al), etc., and the p-type electrode may include nickel (Ni), etc., but are not limited thereto. Aluminum, which is a representative n-type electrode, may form an ohmic junction with the n-type semiconductor unit, and nickel, which is a representative p-type electrode, may form an ohmic junction with the p-type semiconductor unit.

2. Manufacturing Method of Betavoltaic Battery

The present invention provides a method for manufacturing a betavoltaic battery.

The method for manufacturing a betavoltaic battery may include (A) forming an intrinsic semiconductor unit on a substrate; (B) forming an n-type semiconductor unit and a p-type semiconductor unit alternately by irradiating at least a portion of the surface of the intrinsic semiconductor unit with an ion beam; and (C) disposing a beta ray source on the n-type semiconductor unit and the p-type semiconductor unit.

The step (A) for forming an intrinsic semiconductor unit on a substrate may be performed through deposition. The deposition method may comprise, but is not limited to, a thin film growth technology including a molecular beam epitaxy (MBE), a metal organic chemical vapor deposition (MOCVD), or a hydride vapor phase epitaxy (HVPE).

Unlike the p-type semiconductor unit and the n-type semiconductor unit, the intrinsic semiconductor unit may not be doped with impurities, and may include, for example, GaN (gallium nitride). Particularly, in depositing GaN on the substrate, the use of the metal organic chemical vapor deposition (MOCVD) is advantageous in that due to the hexagonal fiber zinc crystal structure and growth direction characteristics of GaN, it is possible to obtain a thin film having a better quality and deposit it on a plurality of substrates at the same time.

The metal organic vapor deposition (MOCVD) as described above is a method of growing a compound crystal by supplying an organometallic compound (organometallic source gas) into a reactor and thermally decomposing it on a heated substrate, and it has the advantage of being able to control the thickness of the intrinsic semiconductor unit to the nano level by controlling the flow rate of the highly purified organic metal compound and the temperature and pressure of the reactor.

The step (B) of forming an n-type semiconductor unit and a p-type semiconductor unit alternately by irradiating at least a portion of the surface of the intrinsic semiconductor unit with an ion beam may comprise a step of forming a p-type semiconductor unit by masking at least a portion of the surface of the intrinsic semiconductor unit and then irradiating an ion beam derived from an element in group 2 of the periodic table to an unmasked portion, or forming an n-type semiconductor unit by masking at least a portion of the surface of the intrinsic semiconductor unit and then irradiating an ion beam derived from an element in group 4 of the periodic table to an unmasked portion.

The n-type semiconductor unit and the p-type semiconductor unit may be formed such that the width of the intrinsic semiconductor unit formed between the n-type semiconductor unit and the p-type semiconductor unit is 100 to 500 nm. If the width of the intrinsic semiconductor unit disposed between the n-type semiconductor unit and the p-type semiconductor unit satisfies the above range, the depletion region may be increased to increase the probability of forming electron-hole pairs derived from injected beta particles.

In this case, the masked region is not irradiated with ion beams, and thus the intrinsic semiconductor unit is not doped. However, in the unmasked area, the ion beam is irradiated, and the surface of the intrinsic semiconductor unit exposed to the ion beam may be doped to a certain region inside the intrinsic semiconductor unit depending on the type and intensity of the ion beam to form an n-type semiconductor unit or a p-type semiconductor unit.

For example, the n-type semiconductor unit is formed by masking at least a portion of the surface of the intrinsic semiconductor unit (or masking also the surface of the p-type semiconductor unit if the p-type semiconductor unit has already been formed) and then irradiating an ion beam derived from an element in group 4 of the periodic table to dope a portion of the unmasked intrinsic semiconductor unit, and the p-type semiconductor unit is formed by masking at least a portion of the surface of the intrinsic semiconductor unit (or masking also the surface of the n-type semiconductor unit if the n-type semiconductor unit has already been formed) and then irradiating an ion beam derived from an element in group 2 of the periodic table to dope a portion of the unmasked intrinsic semiconductor unit. Accordingly, the p-type semiconductor unit may include a compound containing an element in Group 2 or an ion derived from an element in Group 2 as a p-type impurity, and the n-type semiconductor unit may contain a compound containing an element in Group 4 or an ion derived from an element in Group 4 as an n-type impurity.

The masking may be a material through which ion beams do not transmit, and specifically may comprise $SiO_2$, $Si_3N_4$, $Al_2O_3$, etc., but is not limited thereto.

This ion beam irradiation technology is a technology that uses a phenomenon in which the kinetic energy of ion beam particles (ions) having high energy is transferred to the surface of the intrinsic semiconductor unit and converted into kinetic energy, wherein the ions incident on the surface of the intrinsic semiconductor unit to which the ion beam is irradiated may cause a collision cascade of atoms of the intrinsic semiconductor unit and thus may change the properties of the material by elastic or inelastic collision. In this case, if the ion beam energy is higher than the binding energy of the surface atoms, a sputtering phenomenon in which the ions break atomic bonds on the surface and cause atoms to be emitted to the outside occurs. Conversely, if the ion beam energy is lower than the binding energy of atoms on the surface, an ion implantation in which the surface of the ion remains in a collision cascade with the surface atoms occurs. Immediately after ion implantation, a defect occurs in the crystal structure due to collision, and thus the implanted ion must be in a substitution position in the crystal structure in order to act as a dopant, but because of the defect, it does not have the original crystal structure and cannot be electrically activated. Therefore, it is necessary to recrystallize the defective crystal structure through an annealing process to restore it to a normal state, and to cause the implanted ions to move to a substitution site in the crystal structure to act as a dopant and thus to be electrically activated. Methods for the annealing process comprise a furnace annealing method, a rapid thermal annealing method, a laser annealing method, an e-beam annealing method and the like.

The ion implantation energy of the ion beam for forming the n-type semiconductor unit and the p-type semiconductor unit may be 20 keV to 1 MeV. If the ion implantation energy of the ion beam is less than 20 keV, the sputtering phenomenon may occur, and thus the surface of the intrinsic semiconductor unit may be etched away. If the ion implantation energy of the ion beam exceeds 1 MeV, it is inefficient because it can be irradiated or injected beyond the thickness of the intrinsic semiconductor unit, and there may be a problem that on the side of the surface in contact with the beta ray source, the n-type and/or p-type semiconductor unit is not properly formed.

In the case of using the ion beam technology described above, the p-type semiconductor unit or the n-type semiconductor unit can be easily formed locally at a desired location only by masking the grown structure, and unlike the metal organic chemical vapor deposition method in which the depth of the p-type or n-type semiconductor unit depends on the thickness of the grown thin film, the depth of the p-type or n-type semiconductor unit can be easily adjusted according to the ion irradiation energy. Therefore, when forming the p-type or n-type semiconductor unit, it is preferable to use the ion beam technology in terms of convenience and/or effectiveness.

In addition, as the p-type semiconductor unit and the n-type semiconductor unit are formed on the intrinsic semiconductor unit, depletion regions formed at the boundary where the p-type semiconductor unit is in contact with the intrinsic semiconductor unit and at the boundary where the n-type semiconductor unit is in contact with the intrinsic semiconductor unit are exposed to the outside, and thus the beta particles generated from the beta ray source can be directly introduced into the depletion regions without loss occurring while passing through the p-type semiconductor unit or the n-type semiconductor unit as in the existing method. Accordingly, there is an effect that the generation rate of the electron-hole pairs is improved, and ultimately the energy conversion efficiency of the betavoltaic battery is improved, enabling high power generation.

Furthermore, in the case of a betavoltaic battery formed by an ion beam as above, there is an effect that since the p-type semiconductor unit and the n-type semiconductor unit are all exposed to the outside, the etching process for forming electrodes in the betavoltaic battery of the p-n junction structure (or p-i-n junction structure) in the existing layer-by-layer form can be omitted and thus the flatness of the betavoltaic battery device can be maintained, thereby improving the fabrication yield.

The step (C) of disposing a beta ray source on the n-type semiconductor unit and the p-type semiconductor unit may cause the beta ray source to be disposed adjacent to the n-type semiconductor unit and the p-type semiconductor unit. That is, the beta ray source may be placed in contact with the n-type semiconductor unit and the p-type semiconductor unit, or the beta ray source may be spaced apart from the n-type semiconductor unit and the p-type semiconductor unit by a predetermined distance.

The beta ray source is not limited thereto, as long as it is a member of the form containing a radioactive isotope capable of emitting beta rays. Specifically, the beta ray source may be a layer containing a radioactive isotope capable of emitting beta rays.

If the beta ray source is a layer containing a radioactive isotope, it may be manufactured through a plating method. Specifically, the radioactive isotope-containing layer may be formed by dissolving the radioactive isotope in an aqueous sulfuric acid solution to convert it into a radioactive isotope in a sulfated state, and then injecting the sulfuric acid aqueous solution in which the radioactive isotope in the sulfate state is dissolved into the electroless plating solution and electroless-plating on the n-type semiconductor unit and the p-type semiconductor unit or on an arbitrary substrate using the electroless plating solution.

Particularly, in the case of manufacturing a betavoltaic battery by electroless-plating the radioactive isotope-containing layer as described above, there is an effect that the absorption of the beta particles in the p-type semiconductor unit, the n-type semiconductor unit, and the depletion region is maximized, thereby maximizing the power of the betavoltaic battery.

When the beta ray source contains nickel (Ni-63) as a radioactive isotope and is manufactured through a plating method, the radioactive isotope in the sulfate form may be $NiSO_4 \cdot 6H_2O$, and the electroless plating solution may comprise $NaH_2PO_3 \cdot H_2O$, $Na_3C_6H_5O_7 \cdot 2H_2O$, $NaC_2H_3O_2$, $Pb(CH_3COO)_2 \cdot 2H_2O$.

The description of the beta ray source described above may be equally applied to the above beta ray source.

In step (A) above, when forming the intrinsic semiconductor unit, the step of forming the barrier portion inside the intrinsic semiconductor unit may be performed through deposition. The deposition method may include, but is not limited to, a thin film growth technology including a molecular beam epitaxy (MBE), a metal organic chemical vapor deposition (MOCVD), or a hydride vapor phase epitaxy (HVPE).

Specifically, the barrier portion may be formed to be disposed inside the intrinsic semiconductor unit by depositing and forming a first intrinsic semiconductor unit on the substrate, and then forming a barrier portion on the first intrinsic semiconductor unit through deposition and subsequently depositing a second intrinsic semiconductor unit again. As the deposition method, a thin film growth technique using the above-described deposition method may be used, but is not limited thereto.

In this case, the barrier portion may be formed using a material having a larger energy band gap than the material constituting the intrinsic semiconductor unit (the first intrinsic semiconductor unit and the second intrinsic semiconductor unit). When a barrier portion containing a material having an energy band gap larger than the intrinsic semiconductor unit is formed, an energy barrier for electrons or holes is formed inside the intrinsic semiconductor unit, and thus the diffusion phenomenon of electrons derived from the n-type semiconductor unit or holes derived from the p-type semiconductor unit to the substrate can be suppressed, thereby reducing leakage of carriers.

The intrinsic semiconductor unit (the first intrinsic semiconductor unit and the second intrinsic semiconductor unit) may comprise GaN.

The barrier portion may include an aluminum gallium nitride (AlGaN)-based material having a larger energy band gap than GaN comprised in the intrinsic semiconductor unit.

In this case, the aluminum gallium nitride (AlGaN)-based material may include aluminum in an amount of 25 to 40 mol % based on the total number of moles of aluminum and gallium in the aluminum gallium nitride-based material.

Specifically, the barrier portion may include an aluminum gallium nitride (AlGaN)-based material represented by Formula 1 below.

$$Al_xGa_{1-x}N \quad \text{[Formula 1]}$$

wherein x is from 0.25 to 0.4.

If the content of Al in the aluminum gallium nitride (AlGaN)-based material satisfies the above range, a high energy barrier may be formed, and thus high current characteristics can be exhibited inside the betavoltaic battery. If the content of Al in the aluminum gallium nitride (AlGaN)-based material is less than 25 mol %, there may be a problem that the barrier portion does not form a sufficiently high energy barrier to prevent leakage of carriers. If the content exceeds 40 mol %, there may be a problem that since the difference in lattice size between the material of the barrier portion (aluminum gallium nitride (AlGaN)-based material) and the material of the intrinsic semiconductor unit (GaN) is increased, defects occur during the growth of the thin film and the overall characteristics are deteriorated.

The barrier portion is disposed inside the intrinsic semiconductor unit, i.e., at a boundary between the first intrinsic semiconductor unit and the second intrinsic semiconductor unit, and the position where the barrier portion is disposed in an internal region of the intrinsic semiconductor unit may be adjusted depending on the type of beta ray source, i.e., the average energy of the radioactive isotope.

Specifically, if the radioactive isotope of the beta ray source comprises Ni-63, the barrier portion may be formed to be disposed at a distance of 1 to 1.5 μm from the surface of the second intrinsic semiconductor unit. If the radioactive isotope comprises H-3, the barrier portion may be disposed in an inner region located at a distance of 200 to 500 nm from the surface of the second intrinsic semiconductor unit. If the radioactive isotope comprises Pm-147, the barrier portion may be disposed in an inner region located at a distance of 3.5 to 4 μm from the surface of the second intrinsic semiconductor unit. If the barrier portion is disposed at a distance within the above range, there is an effect that the diffusion of electrons or holes derived from injected beta particles can be effectively suppressed, and thus the energy conversion efficiency is increased and the generation of high power is possible.

The thickness of the barrier portion may be 50 to 1000 nm. If the thickness of the barrier portion is less than 50 nm, the thickness of the energy barrier becomes thinner, and thus the problem of the leakage of carriers may occur through a tunneling phenomenon. If the thickness of the barrier portion exceeds 1000 nm, there may be a problem that defects are generated during the growth of the intrinsic semiconductor unit on the barrier portion.

The method of manufacturing the betavoltaic battery may further comprise the steps of forming a p-type electrode electrically connected to the p-type semiconductor unit, and forming an n-type electrode electrically connected to the n-type semiconductor unit.

The step of forming the p-type electrode may comprise a step of forming a p-type electrode electrically connected to the p-type semiconductor unit on one surface of the p-type semiconductor unit, and the step of forming the n-type electrode may comprise a step of forming an n-type electrode electrically connected to the n-type semiconductor unit on one surface of the n-type semiconductor unit.

In this case, the p-type electrode may be formed in a portion of the p-type semiconductor unit and electrically connected to it, and the n-type electrode may be formed in a portion of the n-type semiconductor unit and electrically connected to it, but they are not limited thereto, and they may be disposed in various arrangements and shapes as long as they are electrically connected.

The n-type electrode may include aluminum (Al), etc., and the p-type electrode may include nickel (Ni), etc., but they are not limited thereto. Aluminum, which is a representative n-type electrode, forms an ohmic junction with the n-type semiconductor unit, and nickel, which is a representative p-type electrode, may form an ohmic junction with the p-type semiconductor unit.

The n-type electrode and the p-type electrode may be formed using a thin film growth technique including an electron beam evaporation method, a thermal evaporation method, a sputtering method, an electroless plating method, and the like, but are not limited thereto.

Hereinafter, the present invention will be described in more detail with reference to preferred examples.

However, these examples are intended to explain the present invention in more detail, and the scope of the present invention is not limited thereby.

Example 1

Figure 1:
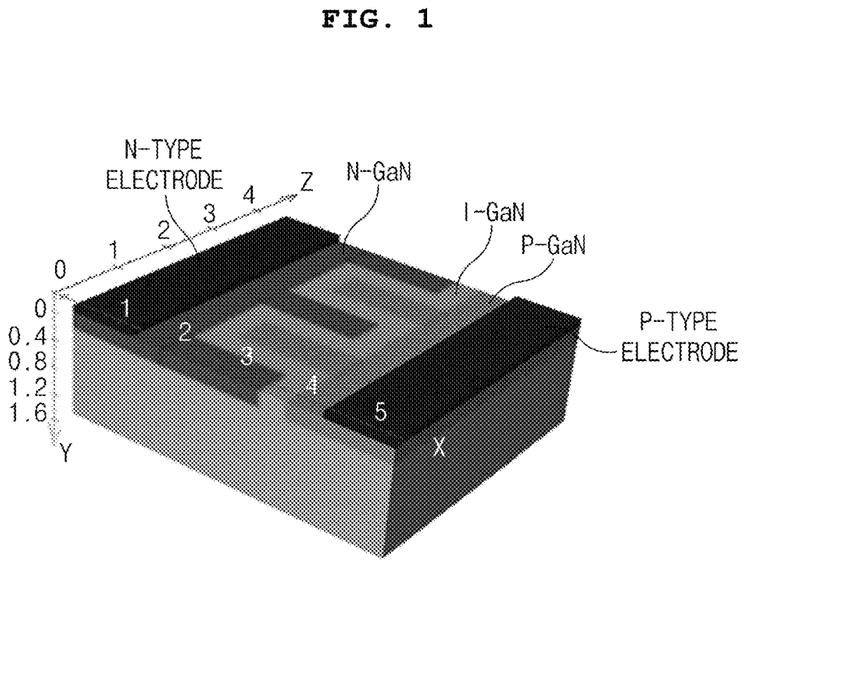
FIG. 1 is a perspective view of the betavoltaic battery according to Example 1 of the present invention.

The structure of the betavoltaic battery is shown in FIG. 1, which comprises an n-GaN unit (n-type semiconductor unit) and a p-GaN unit (p-type semiconductor unit) alternately arranged in at least a portion of the area of the surface of the i-GaN unit in the structure of substrate/i-GaN (intrinsic semiconductor unit), an n-type electrode formed on the n-GaN unit, and a p-type electrode formed on the p-GaN unit.

Example 2

Figure 2:
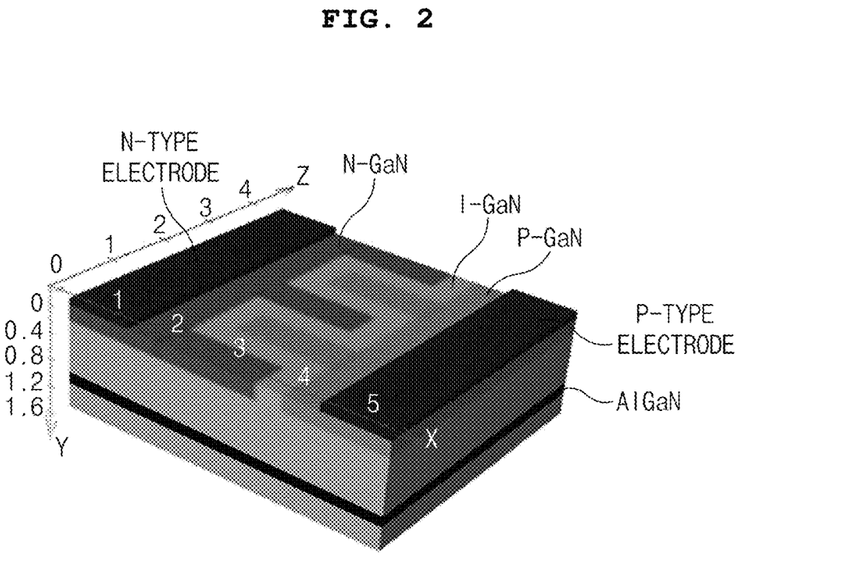
FIG. 2 is a perspective view of the betavoltaic battery according to Example 2 of the present invention.

The same structure as that of Example 1 is shown in FIG. 2, except that in the structure of Example 1, an AlGaN unit (barrier portion) is formed inside the i-GaN unit.

Figure 3:
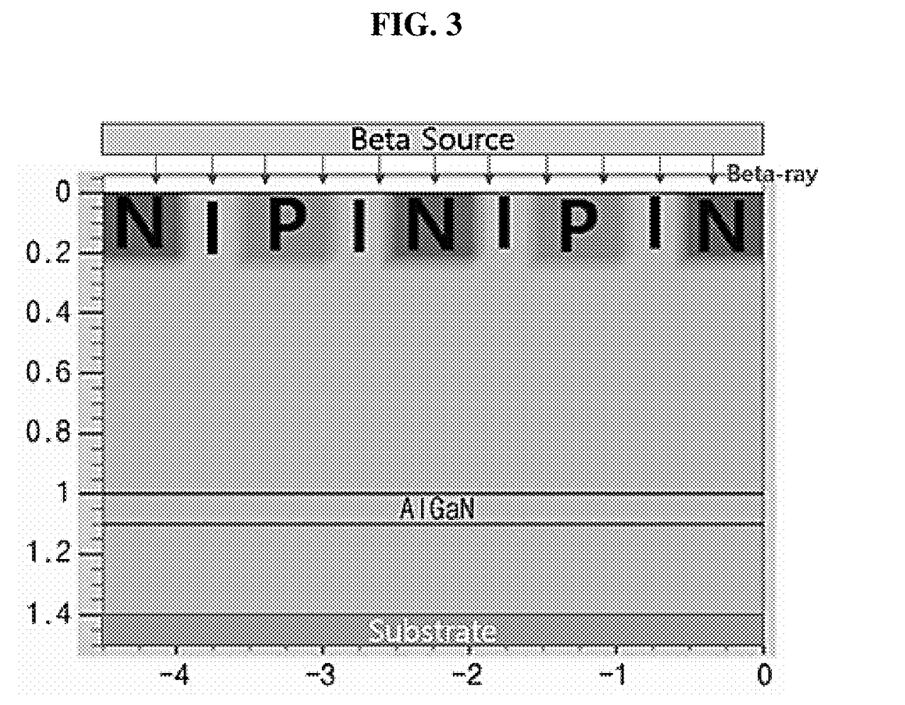
FIG. 3 is a cross-sectional view of the betavoltaic battery according to Example 2 of the present invention.
Figure 4:
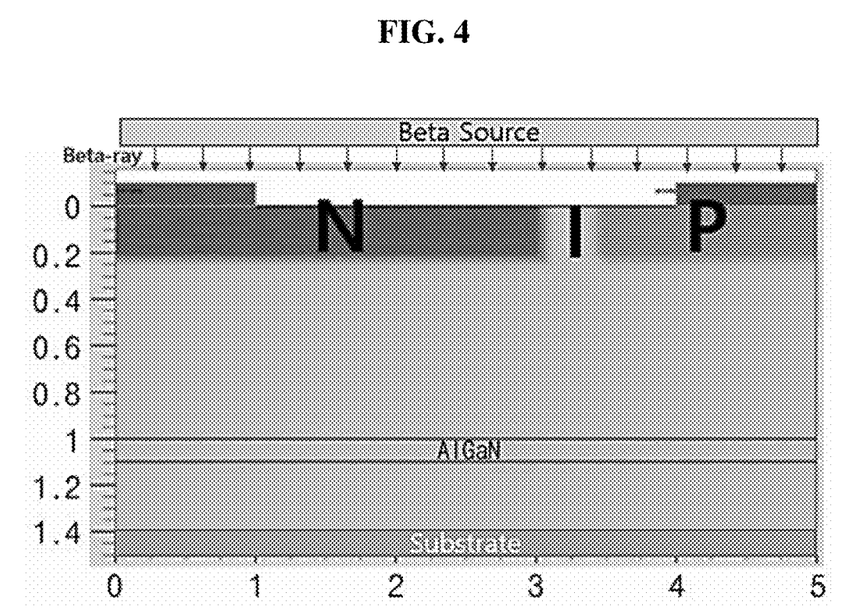
FIG. 4 is another cross-sectional view of the betavoltaic battery according to Example 2 of the present invention.

In addition, the cross section in the x-axis direction of the betavoltaic battery structure of Example 2 is shown in FIG. 3, and the cross section in the z-axis direction of the betavoltaic battery structure of Example 1 is shown in FIG. 4.

Comparative Example 1

Figure 5:
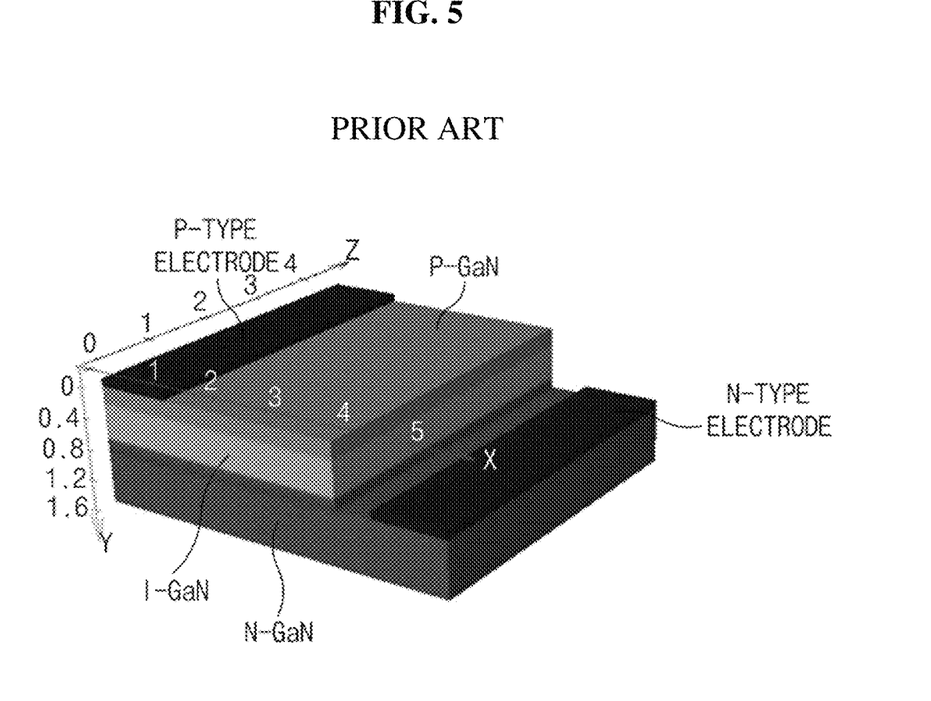
FIG. 5 is a perspective view of a betavoltaic battery with an existing p-i-n junction structure according to Comparative Example 1 of the present invention.

The existing p-i-n type betavoltaic battery structure is shown in FIG. 5.

Experimental Example 1

Figure 6A:
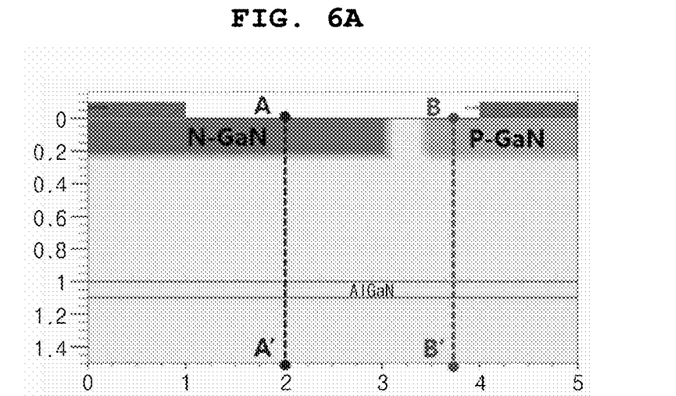
FIGS. 6A, 6B, and 6C are results showing the electron energy distribution according to the position of the AlGaN unit in Experimental Example 1 of the present invention.
Figure 6B:
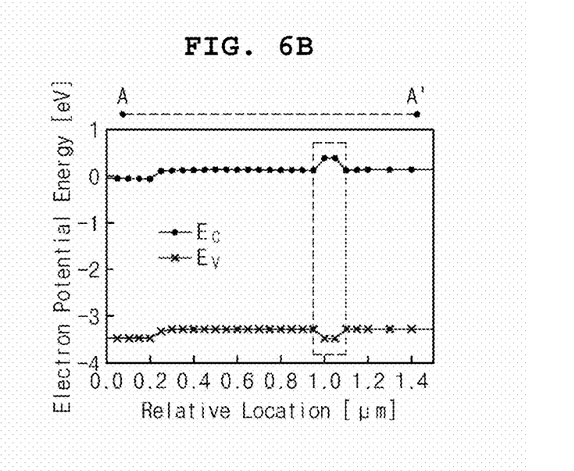
Figure 6C:
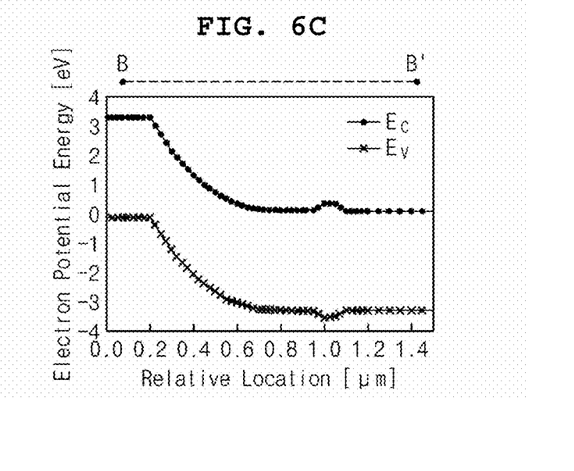

For the betavoltaic battery structure of Example 2, the results of electron energy distribution according to the position (depth) of the AlGaN unit are shown in FIGS. 6A, 6B, and 6C.

Experimental Example 2

Figure 7:
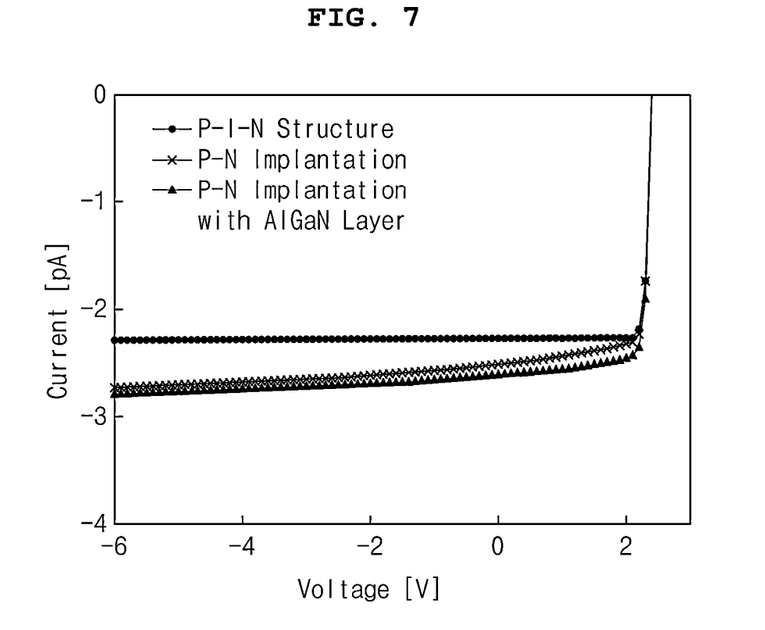
FIG. 7 is a result showing the current characteristics of the betavoltaic battery according to Experimental Example 2 of the present invention.

For the betavoltaic battery structures of Example 1, Example 2 and Comparative Example 1, the results obtained by measuring the characteristics of the current generated when 17 keV (average energy of beta particles of Ni-63) electrons are irradiated, through 3-dimensional technology computer-aided design (TCAD) device simulation, are shown in FIG. 7.

Experimental Example 3

Figure 8:
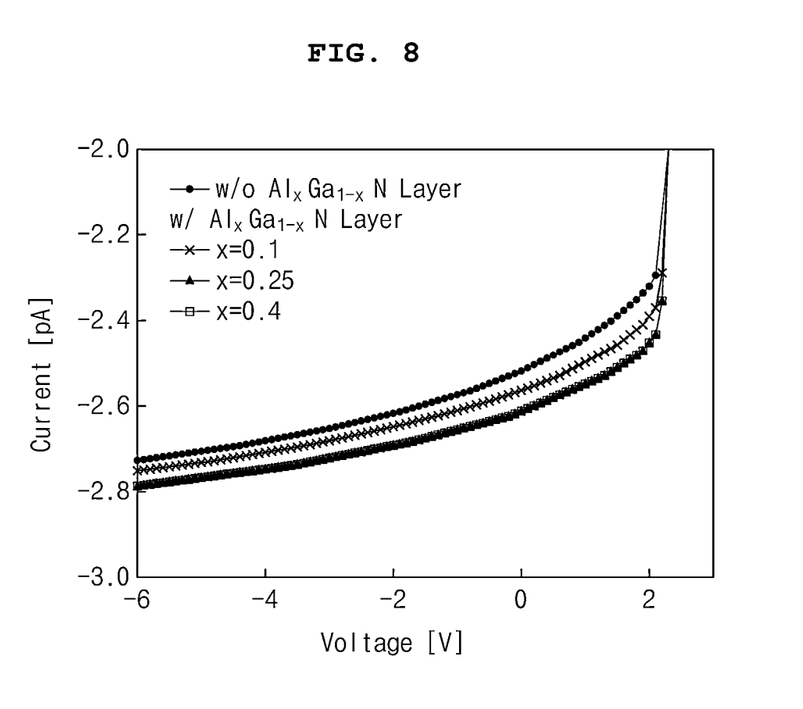
FIG. 8 is a result showing the current characteristics of the betavoltaic battery according to Experimental Example 3 of the present invention.

For the betavoltaic battery structure of Example 2, the results obtained by measuring the characteristics of the current generated according to the content of Al in the AlGaN layer when 17 keV (average energy of beta particles of Ni-63) electrons are irradiated, through 3-dimensional technology computer-aided design (TCAD) device simulation, are shown in FIG. 8.

The invention claimed is:

1. A betavoltaic battery comprising:
a substrate;
an intrinsic semiconductor unit disposed on the substrate;
a barrier portion disposed inside the intrinsic semiconductor unit;
an n-type semiconductor unit and a p-type semiconductor unit that are embedded in a surface of the intrinsic semiconductor unit and arranged alternately on the surface with an intervening area of the intrinsic semiconductor unit; and
beta ray sources that are disposed on the n-type semiconductor unit and the p-type semiconductor unit.

2. The betavoltaic battery according to claim 1, wherein the p-type semiconductor unit is formed by doping a portion of the surface of the intrinsic semiconductor unit using an ion beam derived from an element in group 2 of the periodic table, and the n-type semiconductor unit is formed by doping a portion of the surface of the intrinsic semiconductor unit using an ion beam derived from an element in group 4 of the periodic table.

3. The betavoltaic battery according to claim 1, wherein a width of the intervening area of the intrinsic semiconductor unit disposed between areas of the n-type semiconductor unit and the p-type semiconductor unit is 100 to 500 nm.

4. The betavoltaic battery according to claim 1, wherein depletion regions are formed at boundaries where the p-type semiconductor unit and the n-type semiconductor unit are in contact with the intrinsic semiconductor unit, respectively.

5. The betavoltaic battery according to claim 1, wherein the barrier portion comprises a material having an energy band gap larger than the intrinsic semiconductor unit.

6. The betavoltaic battery according to claim 1, wherein the barrier portion comprises an aluminum gallium nitride (AlGaN)-based material, and the intrinsic semiconductor unit comprises gallium nitride (GaN).

7. The betavoltaic battery according to claim 1, wherein the barrier portion comprises an aluminum gallium nitride (AlGaN)-based material represented by Formula 1 below:

$$Al_xGa_{1-x}N \qquad \text{[Formula 1]}$$

wherein x is from 0.25 to 0.4.

8. The betavoltaic battery according to claim 1, wherein the beta ray source contains a radioactive isotope that includes at least one selected from nickel (Ni-63), promethium (Pm-147) and tritium (H-3).

9. A method for manufacturing a betavoltaic battery comprising the steps of:
forming an intrinsic semiconductor unit on a substrate and a barrier portion inside the intrinsic semiconductor unit;
forming an n-type semiconductor unit and a p-type semiconductor unit alternately with an intervening area of the intrinsic semiconductor unit by irradiating a surface of the intrinsic semiconductor unit with beams; and
disposing a beta ray source on the n-type semiconductor unit and the p-type semiconductor unit.

10. The method for manufacturing the betavoltaic battery according to claim 9, wherein the p-type semiconductor unit is formed by masking a portion of the surface of the intrinsic semiconductor unit and then irradiating an ion beam derived from an element in group 2 of the periodic table to the unmasked portion, or the n-type semiconductor unit is formed by masking a portion of the surface of the intrinsic semiconductor unit and then irradiating an ion beam derived from an element in group 4 of the periodic table to the unmasked portion.

11. The method for manufacturing the betavoltaic battery according to claim 9, wherein the n-type semiconductor unit and the p-type semiconductor unit are formed such that a width of intervening area of the intrinsic semiconductor unit formed between the n-type semiconductor unit and the p-type semiconductor unit is 100 to 500 nm.

12. The method for manufacturing the betavoltaic battery according to claim 9, wherein the ion implantation energy of the ion beam is 20 keV to 1 MeV.

13. The method for manufacturing the betavoltaic battery according to claim 9, wherein the barrier portion is formed using a material having a larger energy band gap than the material constituting the intrinsic semiconductor unit.

14. The method for manufacturing the betavoltaic battery according to claim 9, wherein the barrier portion comprises an aluminum gallium nitride (AlGaN)-based material, and the intrinsic semiconductor unit comprises gallium nitride (GaN).

15. The method for manufacturing the betavoltaic battery according to claim 9, wherein the barrier portion comprises an aluminum gallium nitride (AlGaN)-based material represented by Formula 1 below:

$$Al_xGa_{1-x}N \qquad \text{[Formula 1]}$$

wherein x is from 0.25 to 0.4.

16. The method for manufacturing the betavoltaic battery according to claim 9, wherein the beta ray source is a layer containing a radioactive isotope that includes at least one selected from nickel (Ni-63), promethium (Pm-147) and tritium (H-3).

* * * * *